United States Patent [19]

Evans et al.

[11] Patent Number: 4,640,878
[45] Date of Patent: * Feb. 3, 1987

[54] METHOD OF FORMING A PRESSURE SENSITIVE IMAGE TRANSFER SHEET AND THE PRODUCT THEREOF

[75] Inventors: Robert Evans; Robert Evans, Jr., both of Stamford, Conn.

[73] Assignee: Identicolor International, Inc., New York, N.Y.

[*] Notice: The portion of the term of this patent subsequent to Jun. 24, 2003 has been disclaimed.

[21] Appl. No.: 808,524

[22] Filed: Dec. 13, 1985

Related U.S. Application Data

[63] Continuation-in-part of Ser. No. 710,374, Mar. 11, 1985, Pat. No. 4,596,758.

[51] Int. Cl.$^4$ .................. G03C 1/68; G03C 1/90; G03F 3/00
[52] U.S. Cl. ........................................ 430/15; 430/14; 430/257; 430/258; 430/259; 430/262; 430/954
[58] Field of Search .............. 430/257, 258, 259, 954, 430/262, 14, 15

[56] References Cited

U.S. PATENT DOCUMENTS 3,721,557 3/1973 Inoue .................................. 430/257
4,268,601 5/1981 Namiki et al. ..................... 430/258
4,282,310 8/1981 Edhlund ............................. 430/309

Primary Examiner—Richard L. Schilling
Attorney, Agent, or Firm—Silverman, Cass, Singer & Winburn, Ltd.

[57] ABSTRACT

There is described a photomechanical method for forming pressure sensitive transfer reproductions of color images, either single color or multicolor, upon a substrate involving the forming of a base coat protective layer on a substrate, applying one color ink layer on the base layer and a white ink overlayer on the one color ink layer. The surface of the white ink overlayer is powdered and a layer of photoresist composition is applied. The photoresist covered layered substrate is exposed to a light source through an image carrying photographic negative film to harden the photoresist at the imaged areas thereby forming a mask. Nonhardened photoresist composition areas along with their underlaying layers are removed using stepwise solvent development steps. The steps are repeated where different ink colors are to be applied to form a multicolored image. The final single color image or the final multicolor image, as the case may be, being thoroughly dried, finally coated with a pressure sensitive adhesive to form the image transfer sheet. Drying between each step of formation is essential.

23 Claims, 8 Drawing Figures

METHOD OF FORMING A PRESSURE SENSITIVE IMAGE TRANSFER SHEET AND THE PRODUCT THEREOF

CROSS REFERENCE TO RELATED APPLICATIONS

This application is a continuation-in-part of our pending application Ser. No. 710,374 filed Mar. 11, 1985 now U.S. Pat. No. 4,596,758 entitled: METHOD OF FORMING A PRESSURE SENSITIVE IMAGE TRANSFER SHEET AND THE PRODUCT THEREOF and owned by the same Assignee.

BACKGROUND OF THE INVENTION

This invention relates generally to photomechanical methods of forming pressure sensitive transfer sheets for reproduction of color images and more particularly, provides a method and means for effecting formation of residue-free color images on sheet substrates for artistic and color proofing purposes.

Many photomechanical processes are known for forming color images on selected substrates and then transferring said color images onto selected receptor surfaces by burnishing. Among the common processes are those involving the use of radiation sensitive materials such as photoresists which can be activated by projecting ultraviolet light on the sensitive surface of a photoresist overlay applied to an underlying ink or color carrying material in turn carried by a substrate. The exposed photoresist located at the imaged areas hardens to become a protective layer bonded to the underlying ink layer. The nonexposed areas are unchanged. The unexposed photoresist and the underlying ink areas then are removed by selected solvents in a process which may be referred to as "solvent development". A pressure sensitive adhesive is applied as a layer over the imaged and nonimaged areas as a final step in forming the transfer sheet.

The resulting sheet carrying the adhesive coating is placed image side down on a receptor surface and properly registered. The substrate is burnished at the image portions desired to be transferred while same are in contact with the receptor surface.

The substrate may be provided with a base release coating, usually of a silicone composition, so that when the adhesive is applied over the imaged and nonimaged areas, the adhesive cannot hold to the substrate surface at the nonimaged areas and will be released when burnishing takes place during transfer of the imaged portions. Thus one can state that the adhesive has a greater affinity for the receptor surface than for the siliconed substrate at the burnished areas. The hardened areas defining the image have greater affinity for the adhesive than for the substrate and hence, will adhere to the adhesive at the burnished areas. The underlying ink areas being firmly bonded to the hardened areas (of the imaged photoresist material) also transfers with the adhesive and underlying hardened photoresist areas. The bond formed between the nonimaged substrate areas, the respective intermediate layers and the adhesive coated areas, the nonimaged substrate areas and the respective imaged areas is not as strong as the bond formed between the receptor surface and said adhesively coated areas so that the entire area which has been burnished is transferred to the receptor surface with adhesive residue.

Another problem encountered in prior aforesaid color imaging methods is that they do not use a base release coating but put the release agents in the ink itself which involves the bleeding of the inks into the body of the underlying surface or into the substrate as nonremovable stains. Other problems include the formation of undesirable adhesive halos about the transferred images, the transfer of only portions of the color image, the high cost of the speciality (release) inks, the difficulty in mixing the inks with release materials and unsatisfactory bonding to certain receptor surfaces. Nonuniformity and even pinholes are encountered. Difficulty in transferring fine line images also is experienced with prior methods and image transfer sheet. Additionally, the transferred images often are flat in appearance rather than possessing a desired gloss finish.

SUMMARY OF THE INVENTION

The invention provides a method and means for color imaging capable of use in transferring a single color image and/or multicolor image by pressure contact transfer to a desired receptor base, the printed or the transferred image being clean, free of adhesive residue and free from staining or color bleeding. Transfer is effected by localized burnishing.

The invention provides two lacquer layers between two ink layers and an underlying substrate. Means are provided to prepare the outer surface of the ink layer to receive an overlayer comprising a photosensitive composition. The photosensitive composition preferably is a photoresist material, which when photoactivated at the imaged areas is hardened. The nonhardened remainent photoresist material, as well as the inks below such areas and the underlying coatings are removed by different solvent development procedures leaving the surface completely clean and bared ready for application of pressure sensitive adhesive or the respective coated layers to permit formation of additional overlying images as multicolor images. The invention includes (when necessary) laying down of a layer of opaque material such as white ink, over each respective color ink layer to enable achievement of true opacity whereby providing a finished art result without costly overlays and the employment of trial and error method of selecting colors. Thus the printed final transferred art is capable of being true to the final color application used in the engraving and final printing process. The white ink layer also may be applied beneath the color ink layer and/or as an overlay. A coating of pressure sensitive adhesive is always applied over the final image to complete the pressure sensitive transfer sheet.

BRIEF DESCRIPTION OF THE DRAWINGS

FIG. 1A being a sectional view illustrating the photoresist coated sheet just prior to the imaging step;

FIG. 1B illustrating the photoresist coated imaged sheet subsequent to exposure and removal of the nonhardened photoresist;

FIG. 1C illustrating the photoresist coated imaged sheet subsequent to removal of the ink layers;

FIG. 1D illustrating the photoresist coated imaged sheet subsequent to removal of the lacquer layers; and FIG. 1E illustrating the sheet of FIG. 1D coated with a pressure sensitive adhesive.

DESCRIPTION OF THE PREFERRED EMBODIMENTS

Briefly, the invention shall be described in terms of photomechanically formed, solvent developed single color or multicolor ink images reproduced on a substrate forming a pressure sensitive transfer sheet for transfer of residue-free images to a receptor medium by burnishing. To accomplish this, a removable release lacquer base coat is applied to the substrate and then a nonrelease protective lacquer layer is applied over the base coat on the substrate before the initial color ink layer. After the color ink layer is applied, a white ink layer is applied over the color ink layer to provide total opacity during the steps of forming a single color image or subsequently applied color images to make up a multicolor image. The white ink layer then is powdered in preparation of a photo emulsion layer that will be hardened in desired areas through an imaged film negative that is contacted to the photo emulsion layer and exposed to an actinic light source. The unexposed photo emulsion then is removed by a water solvent solution and then the unexposed (nonhardened) ink and lacquer layers are removed by stepwise solvent procedures. The transfer substrate then has been completely cleaned and bared to receive a final pressure sensitive adhesive overcoat creating a clean residue-free contact transfer sheet of single or multicolor images.

Figure 3:
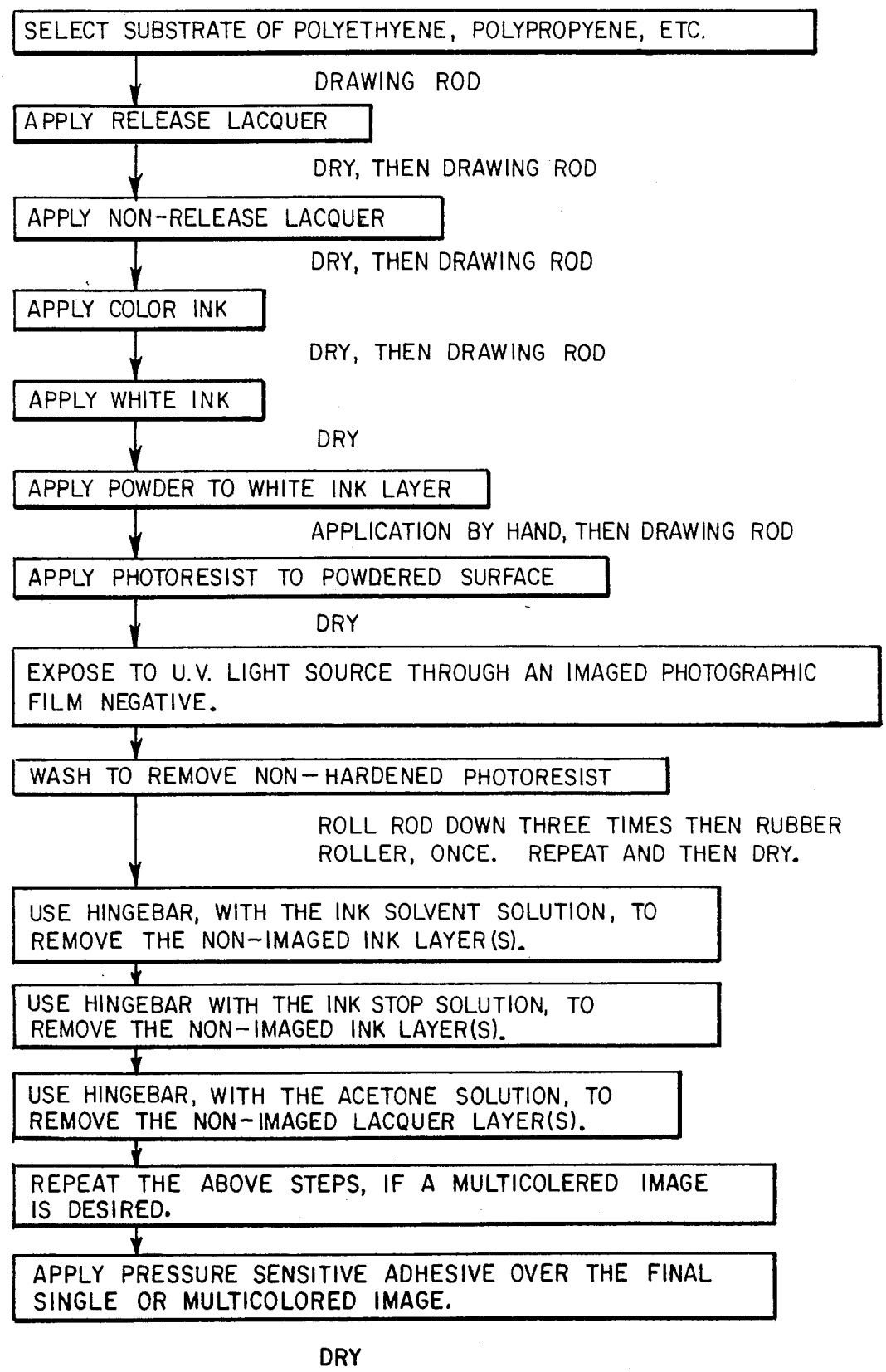
FIG. 3 is a flow chart illustrating the steps of forming the image transfer sheet of FIG. 1E according to the method of the invention.

The method of the invention will be described initially by reference to the flow chart of FIG. 3 which diagrams the method steps practiced to form the structure illustrated in FIG. 1A which represents a single color image application. The subsequent illustrations of FIGS. 1B to 1E illustrate the method steps for developing the single color image after exposure to ultra violet light of the structure of FIG. 1A.

Figure 1A:
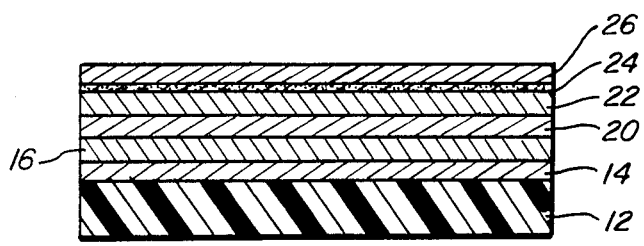
FIGS. 1A to 1E are sectional views illustrating selected sequential stages in the method of forming a single color image transfer sheet of the invention.
Figure 1B:
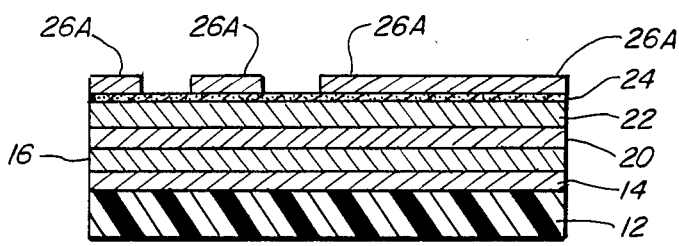
Figure 1C:
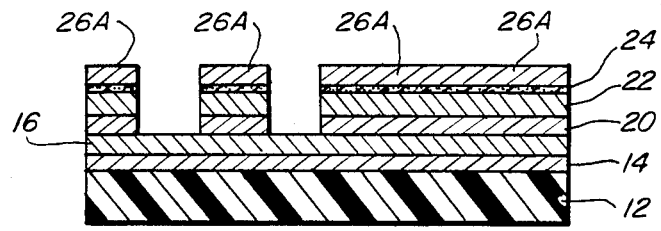
Figure 1D:
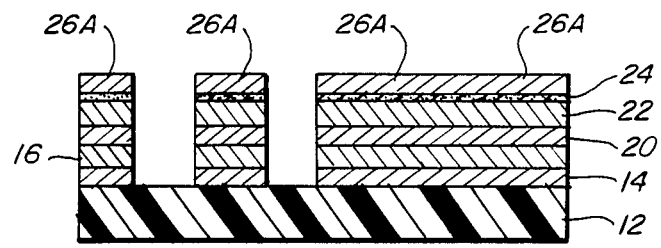
Figure 1E:
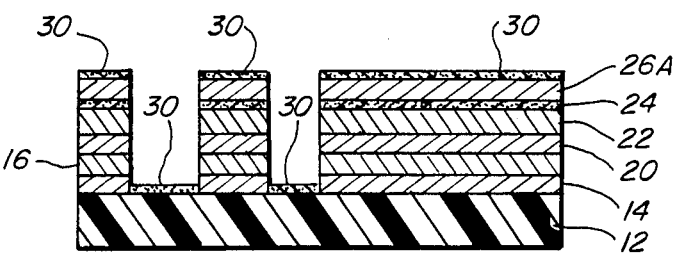

Referring to FIG. 1E, there is presented a pressure sensitive transfer sheet 10 formed according to the invention and consisting of layers of individual color inks and lacquers which are applied successively to a substrate. The individual illustrated image was taken from single color separated photographic negatives, for example. The substrate employed normally does not carry a manufactured or prelayered release coating. Preferably, the substrate surface is smooth.

The substrate 12 may preferably comprise a noncoated polyester, polyethylene or polypropylene film sheet. The sheet generally employed herein is between 5 and 6 mils in thickness. The substrate 12 carries a layer 14 formed of a clear lacquer base coat (which includes release agents as a part thereof) on one surface thereof. The base coat 14 functions both as a protective layer and a release agent for the substrate. An example of a useful base coat material is:

A modified vinyl lacquer with silicone and wax additives (approx 10%)

Acetone solvent (Aprox 62%)

Using a #12 wire-wound draw rod 18, the base coat material is drawn along the surface of the substrate to provide the base coating 1 to 2 mils in thickness over the entire substrate sheet 12. A conventional exhaust fan is employed to disperse fumes during the coating process. In drawing down the layer 14 of base coat, considerable care is taken to employ an even motion with light to moderate pressure, taking care to avoid hesitation. The base coat 14 is dried thoroughly before undertaking the next step of applying a second layer 16 of compatible nonrelease lacquer. This second layer 16 is not required but is advisable to give more stability to the images above. Layer 16 is dried completely.

The desired printing (color) ink 20 next is applied to the dry second lacquer surface 16 by drawing down the ink, again employing a 190 12 wire mesh rod 18. Again a firm steady motion and moderate pressure is employed to assure a line free cover as well as color uniformity. If the spreading of the ink is too fast, there is a skipping effect over the entire substrate sheet. If the ink is spread too slowly, the ink may dry and a skin may form over areas of the coating. Ordinarily, the ink is drawn from 5 to 10 seconds to provide a layer approximately 1 to 2 mils in thickness. The resulting ink layer 20 is permitted to set for one or two seconds, and then is dried thoroughly, as by use of a conventional portable hair dryer, preferably using a sweeping motion to achieve uniformity. One example of a preferred gloss ink is a polyamide co-solvent type having a co-solvent of isopropyl alcohol (98% anhydrous) with finely milled pigments.

A white ink overlayer 22 preferably is applied to the dried ink layer 20 to insure complete opacity of the underlying color when transferred. The white ink layer 22 has a thickness of from 1 to 2 mils. The white ink also aids in preserving and protecting the previously printed color. Once applied, the white ink layer 22 is dried thoroughly prior to the performance of the next step of the process.

The exposed resulting dried surface of the white ink layer 22 of the color ink layer 20, as the case may be, thereafter is dusted with fine talc or resin powder 24 to ready the said surface to accept a photosensitizing composition 26. A small quantity of the talc or resin powder is poured upon the ink layer 20 or 22 and, using an applicator, is spread over said layer 20 or 22. Excess powder is removed. The powder avoids the repulsion of the photosensitizing material from said ink layer 20 or 22.

The sensitizing agent commonly referred to as a photoresist composition is drawn down the exposed powdered surface and forms a layer 26 thereover. Thorough drying is initiated and continued for about 45 seconds or until thoroughly dry. Once the photoresist layer 26 had been laid down, other activities should be carried out only in the presence of yellow or red light with the remaining room lighting screened away to prevent premature exposure of the photoresist. The photoresist material may be selected from among the following composition but the choice is not limited thereto. One example of a photoresist composition which has been employed to provide photosensitizing layer 26 is:

145 grams Casein
45 Milliliters Ammonium hydroxide
15 grams Ammonium Dichromate
4.5 Milliliters of Laborator Aerosol
110 ounces of water (distilled)

The preferred thickness of the photoresist layer is from 0.5 to 1 mil.

The layered substrate illustrated in FIG. 1A now is ready for exposure to light to form the first color image. The length of exposure of the photoresist-covered layered material is determined by the type of exposure equipment employed. Preferably, a NuArc flip top plate maker apparatus (not shown) is used for exposure purposes. A color separation of a composite image is placed on the layered sheet of FIG. 1A. Registration is achieved manually with minimum movement of the film negative or layered sheet. Depending upon the type of equipment employed and the relative size of of the image and ink color; normally, the duration of exposure can be expected to be from about 10 to 110 seconds. Exposure of between 10 and 60 seconds will result in a satisfactory image production. Black, being the most dense, will require the longest exposure time while white (or pale blue) will require the least exposure time.

Exposure of the photoresist-coated layered sheet causes the photographic sensitizing of the photoresist composition layer 26, hardening same at the exposed areas to define a mask 26A (FIG. 1B) in the form of the image. Now the nonhardened areas of the photoresist layer 26 are removed as shown in FIG. 1B, here preferably, by so-called solvent development i.e. selected solvent action, to leave the hardened, exposed photoresist cover or the mask 26A protecting the imaged color ink areas underlying the mask 26A.

The removal of the nonhardened photoresist is effected using photoresist solvent such as

EXAMPLE I

A solution of 0.75 ounces of Alkanol WXN in 5 gallons of distilled water.
or, alternatively,

EXAMPLE II 4 grams Ammonium Carbonate
60 Milliliters Laboratory Aerosol
2 Milliliters Monoethanolamine
1 gallon of distilled water.

The selected photoresist solvent is applied to the surface of the exposed sheet using the same type of wire mesh rod 18 as employed earlier except that the rod 18 is rolled instead of being drawn. A rubber roller 38 then is rolled over the entire sheet surface to remove excess solvent. Rolling of the wire mesh rod 18 and the rubber roller 38 in lieu of drawing the same across the printed surface avoids slipping which is likely to result in scratching of the area and causing the underlying ink to be washed away where the protective mask 26A is scratched.

Once the nonhardened photoresist material has been removed, it is necessary to undertake the removal of the underlying ink layers, to result in the structure represented in FIG. 1C. Generally, one requires a first treatment with an "ink solvent" with a final wash employing a so-called "ink stop". The preferred "ink solvent" is a lactol-isopropyl alcohol mixture comprising 75% to 80% lactol and 25% to 20% isopropyl alcohol, respectively.

The preferred ink stop employed herein is lactol whose specific gravity at 60° C. is 0.738; whose distillation range is 92° to 106° Centigrade; whose flash point is 23° F. and whose aromatic content is 8.37.

Figure 4:
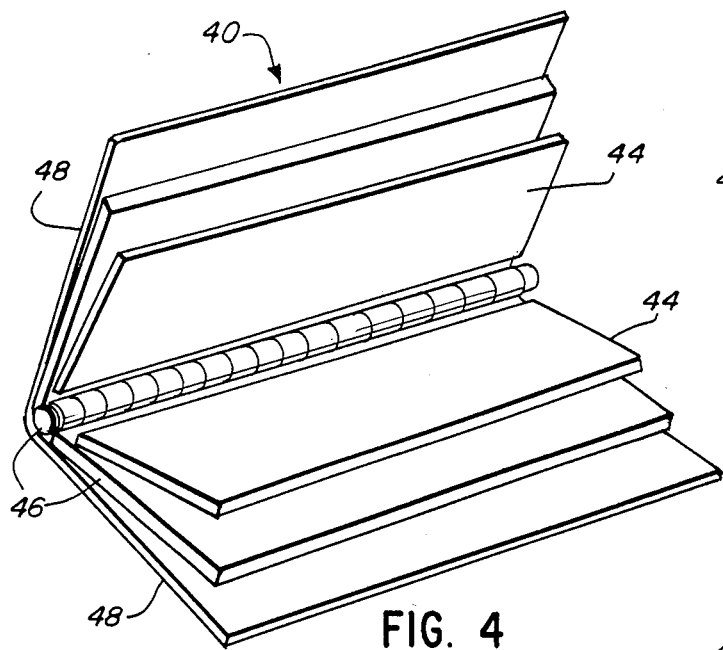
FIG. 4 is a perspective view of a hinge bar washing assembly which can be used in practicing the invention.
Figure 5:
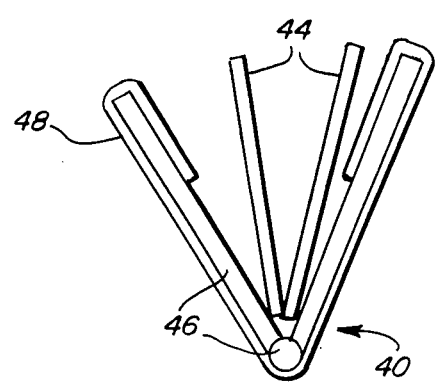
FIG. 5 is an end view of the hinge bar washing assembly of FIG. 4, shown in operative condition.

In FIGS. 4 and 5, a hinge bar washing assembly 40 is illustrated which can be used in performing the step resulting in the structure of FIG. 1C. This convenient washing assembly 40 comprises a hinge bar 46, a strip 48 of sponge material which has been formed into an elongate V configuration and the bar being fastened to the center of the V. The sponge is clamped by clamp 44.

Figure 6:
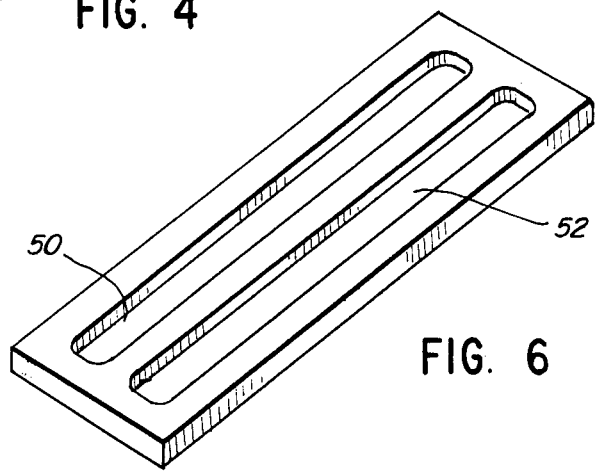
FIG. 6 is a perspective view of a trough employed to hold the development solvents.
Figure 7:
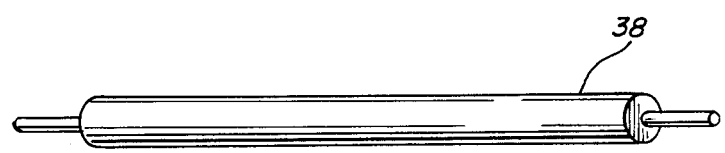
FIG. 7 is a perspective view of the roller employed in photoresist solvent development.
Figure 8:
FIG. 8 is a perspective view of the wire wound rod used to apply the various coatings utilized in practicing the invention.

In FIG. 6 the ink solvent and ink stop solution are are introduced into a tray of a pair of side by side elongated troughs 50, 52 respectively. One side of the sponge 48 of the hinge bar assembly 40 can be dipped into the ink solvent solution and the opposite side of sponge 48 dipped into the ink stop solvent. After removal of the nonhardened photoresist from layer 26 and drying, the print is wiped first with the ink solvent and then wiped with ink stop solvent. The wet sponge pad is wiped over the photoresist-free surface two or three times to remove the unexposed color ink layers. The number of wipes is dependent upon the number of ink layers to be removed. Next, the ink stop is applied to the resulting surface. Ink stop is not always necessary, but is advisable. The first ink solvent wipe preferably is performed slowly with a few seconds delay to provide enough time for the ink layers to separate slightly from their underlying layers at the nonimaged areas.

The base coat lacquer layer and the covering lacquer layer do not come off in these solvent wipes since the lacquer is not compatible to these solvents. To remove the now remaining lacquer layers in order to form the structure of FIG. 1D, a lacquer solvent such as acetone is used which in turn is not compatible to the alcohol based ink solvent. Using the same type of hinge bar washing assembly 40 and a newly clamped sponge 48 the lacquer base coat and its covering lacquer layer is removed by successive wipes without having any damaging effect on the ink layers formed above. The resulting transfer sheet carrying the transferable images then is blow-dried thoroughly to remove all solvent.

When successive colors are to be applied, one must apply another base coat layer 14 and covering lacquer layer 16 before proceeding to the application of the next color ink.

Figure 2:
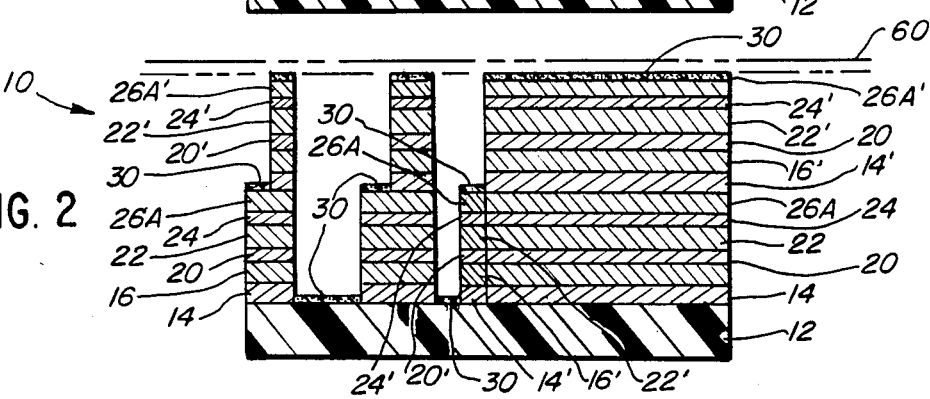
FIG. 2 is a fragmentary sectional view taken through a transfer sheet which was produced by the method of the invention and illustrating a multicolor image, greatly exaggerated.

In FIG. 2, there is illustrated a completed transfer sheet 10' formed according to the invention but carrying two different color images. The first formed color image is the same as carried by the illustrated sheet of FIG. 1E. The second image is represented by the layers carrying primed reference characters. The layered make-up of the second color image is the same as that of the single color image, but the adhesive layer is applied only once after the two color images have been formed and, of course dried. A protective, removable siliconed paper backing sheet 60 is applied over the completed transfer medium 10'.

After completing the application of a single and/or multicolor image, the pressure sensitive transfer medium is formed by finally applying a suitable pressure sensitive adhesive 30 as an overlay upon the surface carrying the completed final image so that the final composite color image can be transferred to a receptor medium by placement of the sheet thereon, locating te image and burnishing the substrate over the image areas. In FIG. 1E, the adhesive layer 30 is illustrated as applied to a single color image carrying sheet 10 and only once after all of the desired image has been produced. It is the final coating process in the production of a complete transfer sheet 10'. The preferred thickness of the adhesive layer is from 0.5 to 1.5 mil. The adhesive coated sheet surface temporarily adheres to the receptor surface, i.e., "grabs" same so that the image is not shifted or otherwise moved during the burnishing process. The adhesive composition has a greater affinity for the underlying surface nonimaged substrate areas than the receptor surface and hence upon burnishing, there is a clean transfer of only the imaged areas. A clean break is made along the edges of the image. No adhesive residue or halo remains on the receptor medium.

It is seen that the invention provides, a method of producing a finer and more versatile pressure sensitive transfer sheet by developing a release base coat utilizing lacquer as the incorporating vehicle for the wax and silicone "slip" agents. The advantage of using lacquer is that it can also be used as a protective shield to the substrate during all the overlayering of the ink layers, the photo emulsion layers and the development procedures used to create the finished color images. This can be done since the lacquer is incompatible to all the overlayered ink and photo emulsion layers and to the development procedures used to make these images.

In turn, by the lacquer solvents being incompatible to the chemistry used to make these overlayed ink images, the lacquer can be removed from the nonimaged portions of the substrate without disturbing the imaged portions thereon.

In addition, by incorporating the release agents in the lacquer, the final lacquer solvent removal step also cleans and bares the substrate without leaving any silicone or "slip" contamination, thereby allowing the final adhesive application to bond so well to the nonimaged portion of the substrate that no surrounding adhesive will transfer during normal burnishing and thereby leaving an undesirable residue.

However, if another color is desired as a second image, instead of applying the final adhesive, another coating of release lacquer (base coat) can be overlayered on the substrate that will not only provide a new protective shield to the substrate but to the other ink images printed thereon.

This also provides a new base whereby this application and removal of the base coat release lacquer can be done as many times as needed to make as many different overlayered color images as needed.

What we claim is:

1. A method of forming a pressure sensitive transfer sheet having at least one color ink image or multicolor images on a substrate that can be burnished to any selected receptor medium or the like comprising the steps of:

(a) applying a release lacquer base coat on the substrate;
    (b) drying said base coat;
    (c) applying a non-release lacquer onto the base coat;
    (d) drying said non-release lacquer coat;
    (e) applying a color ink layer on the dried non-release lacquer coat;
    (f) drying the color ink layer;
    (g) applying a white ink layer to the dried color ink layer;
    (h) drying the white ink layer;
    (i) applying a fine talc coating to the dried white ink layer;
    (j) applying a layer of photosensitive photoresist composition to the powdered ink layer;
    (k) drying the photoresist layer;
    (l) placing a film negative carrying a desired image face down upon the dried photoresist layer in contact relationship thereto;
    (m) exposing the layered substrate to an actinic light source through the film negative for a predetermined duration to form a hardened photoresist covering layer over the imaged areas only;
    (n) removing nonimaged layer of photoresist through photoresist solvent development;
    (o) drying the resultant surface;
    (p) removing layered nonimaged ink areas by selective solvent development;
    (q) drying the resultant surface;
    (r) removing layered nonimaged areas of lacquers by selective lacquer solvent development;
    (s) drying the resultant surface;
    (t) applying a coating of pressure sensitive adhesive composition as the final overlayer to the entire surface and drying same to complete the pressure sensitive transfer sheet.

2. The method as claimed in claim 1 in which the release lacquer base coat material includes wax and silicone release agents.

3. The method as claimed in claim 1 in which the release lacquer base coat is incompatible with the solvents employed in the ink solvent development steps.

4. The method as claimed in claim 1 in which the steps of removing the layered nonimaged areas include first applying a photoresist solvent to remove all of the unexposed photoresist layer from the nonimaged surface.

5. The method as claimed in claim 4 in which the step of removing the layered nonimaged areas further includes the steps of applying an ink solvent to the remainent unexposed ink layers and thereafter applying an ink stop thereto, until the surface is ink-free.

6. The method as claimed in claim 1 in which the substrate is selected from the group of polyester polypropylene and polyethylene film.

7. The method as claimed in claim 1 in which the nonimaged portion of the lacquer base coat is finally removed with its release agents by applying lacquer solvent to clean and bare the substrate to its lacquer free original condition without any silicone or wax contamination.

8. The method as claimed in claim 1 in which the solvents used to remove the base coat and lacquer layers are incompatible to the ink layers.

9. The method as claimed in claim 1 in which the photoresist material is water soluble and insoluble to the ink and lacquer solvents.

10. The method as claimed in claim 4 in which a new layer of release base coat and subsequent nonrelease lacquer is applied thereon without disturbing the color image therebelow.

11. The method as claimed in claim 1 in which all release elements are removed from the substrate firmly to bond the pressure sensitive adhesive to the nonimaged areas whereby to prevent release thereof from the substrate during normal burnishing.

12. The method as claimed in claim 1 wherein the steps of (a) to (s) are repeated successively with different film negatives in registry and at least a second color ink to form a multilayered multicolor composite image, the step (t) of applying a coating of pressure sensitive adhesive being performed only over the dried final multicolor composite image.

13. A method of forming a pressure sensitive transfer sheet having at least one color ink image on a substrate for color proofing or the like comprising the steps of:
   (a) applying a base release lacquer layer on the substrate;
   (b) thoroughly drying said base release lacquer layer;
   (c) applying a color ink layer on the dried base release lacquer layer;
   (d) drying the color ink layer;
   (e) applying a white ink layer to the dried color ink layer;
   (f) drying the white ink layer;
   (g) applying a fine powder coating to the dried white ink layer;
   (h) applying a layer of photoresist composition to the powdered ink layer;
   (i) drying the photoresist layer;
   (j) placing a film negative carrying a desired image for transfer upon the dried layered substrate in closely proximate relationship thereto;
   (k) exposing the layered substrate to a radiation source through the film negative for a predetermined duration to form a hardened photoresist covering layer over the imaged areas only;
   (l) removing the nonimaged layer of photoresist by photoresist solvent development;
   (m) drying the resultant surface;
   (n) removing the ink layers in the nonimaged areas by selective solvent development;
   (o) drying the resultant surface;
   (p) removing the lacquer layer in the nonimaged aras by selective lacquer solvent development;
   (q) drying the resultant surface, and
   (r) applying a coating of pressure sensitive adhesive composition as an overlayer to the surface carrying the final dried image and drying same to form the pressure sensitive transfer sheet.

14. The method of color imaging as claimed in claim 13 and the further steps of repeating the steps of (a) to (q) using a different film negative in registry and at least a second different color ink to form a multicolor composite image, the application of a coating of pressure sensitive adhesive composition occuring only subsequent to completion and drying of the final multicolor composite image.

15. The method as claimed in claim 13 in which a nonrelease lacquer layer is applied to the dried base release lacquer layer and dried and the subsequent layers are applied thereafter in the designated order, both lacquer layers being removed by said selective lacquer solvent development.

16. The method as claimed in claim 13, in which the base release lacquer layer is formed by drawing a release lacquer base coat material across one substrate surface.

17. The method as claimed in claim 13 in which the substrate is selected from the group comprising polyester, polyethylene and polypropylene film.

18. A pressure sensitive transfer sheet having at least one color ink image on a substrate for color proofing or the like comprising a substrate, a dry release lacquer base layer on the substrate; a dry color ink layer on the dry release lacquer base layer; a dry white ink layer on the dry color ink layer; a fine powder coating on the dry white ink layer; and a hardened photoresist layer on the powered ink layer resulting from exposure of the layered substrate to a radiation source through an image carrying film negative for a predetermined duration forming imaged and nonimaged areas, the hardened photoresist layer being present only over the imaged areas; the lacquer, ink and powdered layers being present only between the substrate and the hardened photoresist layers, where present, and a pressure dry pressure sensitive adhesive layer over the entire surface including both imaged and nonimaged areas.

19. The pressure sensitive transfer sheet according to claim 18 wherein there are plural superimposed imaged areas formed employing different film negative in registry and at least a second different color ink whereby to form a multicolor composite image, each color image characterized by lacquer, ink layers, powdered layers and hardened photoresist layers but only one pressure sensitive adhesive layer being present over the entire outer surface as a final coating.

20. The pressure sensitive transfer sheet according to claim 18 wherein a dry non-release lacquer layer is interposed between the dry release lacquer base layer and the first applied ink layer where present.

21. The pressure sensitive transfer sheet according to claim 19 in which a dry non-release lacquer layer is interposed between the dry release lacquer base layer and the first applied ink layer in each instance where present.

22. An exposure ready image transfer medium comprising a substrate, a dry release lacquer base layer on the substrate; a dry color ink layer on the dry release lacquer base layer; a dry white ink layer on the dry color ink layer; a fine powder coating on the dry white ink layer; and a dry layer of photoresist composition on the powdered ink layer, the photoresist layer capable of being exposed to a radiation source through an image carrying film forming imaged and non imaged areas, the non imaged areas being subject to removal by selective solvent development with an overall pressure sensitive adhesive material applied as a final overcoat.

23. The transfer medium as claimed in claim 22 in which a dry non-release lacquer layer is interposed between the release lacquer layer and the dry color ink layer.

* * * * *